United States Patent [19]

Urasato et al.

[11] Patent Number: 5,011,639
[45] Date of Patent: Apr. 30, 1991

[54] METHOD FOR THE PREPARATION OF A SINTERED BODY OF SILICON CARBIDE

[75] Inventors: Nobuaki Urasato; Minoru Takamizawa; Akira Hayashida; Hiromi Ohsaki; Jiyunitirow Maruta, all of Niigata, Japan

[73] Assignee: Shin-Etsu Chemical Co. Ltd., Ote, Japan

[21] Appl. No.: 453,038

[22] Filed: Dec. 12, 1989

Related U.S. Application Data

[63] Continuation of Ser. No. 179,480, Apr. 8, 1988, abandoned, which is a continuation-in-part of Ser. No. 43,603, Apr. 28, 1987, abandoned.

[30] Foreign Application Priority Data

Jun. 5, 1986 [JP] Japan ................. 61-130914

[51] Int. Cl.$^5$ ............................. C04B 35/56
[52] U.S. Cl. ....................... 264/65; 501/88; 501/92
[58] Field of Search ............ 264/65; 501/88, 92

[56] References Cited

U.S. PATENT DOCUMENTS

| | | | |
|---|---|---|---|
| 4,209,474 | 6/1980 | Prochazka | 264/65 |
| 4,237,085 | 12/1980 | Smoak | 264/65 |
| 4,346,049 | 8/1982 | Coppola et al. | 264/65 |
| 4,541,975 | 9/1985 | Honma et al. | 264/65 |
| 4,564,490 | 1/1986 | Omori et al. | 264/65 |
| 4,668,452 | 5/1987 | Watanabe | 264/65 |

FOREIGN PATENT DOCUMENTS 60-46912 3/1985 Japan .

Primary Examiner—James Derrington
Attorney, Agent, or Firm—Hopgood, Calimafde, Kalil, Blaustein & Judlowe

[57] ABSTRACT

A powdery mixture of a fine silicon carbide powder admixed with boron or a boron compound, e.g. boron carbide, titanium boride and boron oxide, as a sintering aid is compression-molded into a green body which is subjected to a sintering treatment into a sintered body. Different from conventional methods in which the sintering treatment is performed always in an atmosphere of an inert gas, e.g. argon, the sintering treatment in the inventive method is performed in an atmosphere of a rare gas containing 0.005–5% by volume of nitrogen. The sintered body of silicon carbide obtained by this method has an outstandingly high electric volume resistivity of $10^{10}$ to $10^{13}$ ohm.cm and a coefficient of thermal conductivity of 100–220 W/m.K.

7 Claims, No Drawings

METHOD FOR THE PREPARATION OF A SINTERED BODY OF SILICON CARBIDE

This application is a continuation of application Ser. No. 179,480, filed Apr. 8, 1988 now abandoned, which is a continuation-in-part application from the pending U.S. patent application Ser. No. 043,603 filed April 28, 1987 now abandoned.

BACKGROUND OF THE INVENTION

The present invention relates to a method for the preparation of a sintered body of silicon carbide or, more particularly, to a method for the preparation of a sintered body of silicon carbide having high electric insulation and thermal conductivity and useful as a material of electronic components such as substrate plates of integrated circuits.

As is well known, sintered bodies of silicon carbide are widely used in a variety of applications by virtue of their excellent properties such as heat resistance, abrasion, resistance, mechanical strength and corrosion resistance. A recently highlighted application of sintered bodies of silicon carbide having high electric insulation and thermal conductivity is as a material of various electronic components such as substrate plates of integrated circuits.

It is however, technologically a difficult matter to remarkably increase the electric resistivity and thermal conductivity of sintered bodies of silicon carbide. For example, a method is proposed to admix the silicon carbide powder with beryllium oxide as a sintering aid. A difficult problem in this method is that beryllium compounds in general have strong toxicity to cause adverse effects on the workers' health unless the material is handled with utmost care. Moreover, the effect of beryllium oxide as a sintering aid is relatively small so that sintered bodies cannot be imparted with a satisfactorily high density when sintering is performed under normal pressure necessitating use of a very expensive apparatus for hot-pressing. In addition, scantiness of the resources of beryllium in nature greatly limits the supply of beryllium oxide which is necessarily very expensive.

On the other hand, most of the currently used heat-resistant substrate plates of integrated circuits are made of a sintered body of aluminum oxide in view of the inexpensiveness while aluminum oxide has a thermal conductivity of 20 W/m.K and a coefficient of thermal expansion of $8 \times 10^{-6}/°C.$, which value is considerably larger than the value of $3.5 \times 10^{-6}/°C.$ of the single crystal of semiconductor silicon. Accordingly, it is eagerly desired to develop a highly heat-radiative material to replace aluminum oxide. Besides silicon carbide, one of the promising candidate materials is aluminum nitride but aluminum nitride is not free from serious disadvantages of greatly limited fields of applications due to the inherently poor thermal conductivity and low resistance against chemicals.

U.S. Pat. No. 4,209,474 teaches a method for the preparation of a sintered body of silicon carbide having N-type semiconductivity, according to which a powder of silicon carbide is admixed with a boron additive and the powdery mixture is shaped and sintered at a temperature in the range from 1280° C. to 2300° C. in an atmosphere in which the partial pressure of nitrogen is at least $10^{-1}$ atmosphere. Although this method is effective in obtaining the desired semiconductivity, no satisfactory sintered body of silicon carbide can be obtained when application thereof is desired as a material of electrically insulating substrate of integrated circuits.

SUMMARY OF THE INVENTION

An object of the present invention is therefore to provide a method for the preparation of a sintered body of silicon carbide having high electric insulation and thermal conductivity without using beryllium oxide as a sintering aid to be freed from the above described problems and disadvantages accompanying the use of a beryllium compound.

Thus, the method of the present invention for the preparation of a sintered body of silicon carbide comprises:

(a) admixing a fine powder of silicon carbide with boron or a boron compound in an amount in the range from 0.1 to 5.0% by weight as boron to give a uniform powdery mixture;

(b) molding the powdery mixture by compression to give a green body; and (c) heating the green body under normal pressure in an atmosphere of an inert gas, e.g., rare gas, containing nitrogen in an amount in the range from 0.005% to 5% by volume or, preferably, from 0.01% to 2% by volume to cause sintering thereof into a sintered body.

DETAILED DESCRIPTION OF THE PREFERRED EMBODIMENTS

As is described in the above given summary of the invention, the characteristic feature of the invention consists in the admixture of the silicon carbide powder with a specified amount of boron or a boron compound and sintering of the green body in an atmosphere containing a specified concentration of nitrogen.

This method is so effective that the sintered body of silicon carbide thus obtained may have an electric resistivity as high as $10^{10}$ to $10^{13}$ ohm.cm and a coefficient of thermal conductivity as high as 100 to 220 W.m.K. Moreover, the process of sintering can be performed under normal pressure without using an expensive apparatus of hot-press. Furthermore, no toxic materials need be used in the process as an additive in the silicon carbide powder. These features of the inventive method afford a great advantage that the desired sintered bodies of silicon carbide can be manufactured in any large quantities at an outstandingly low cost.

The basic starting material in the inventive method is a fine powder of silicon carbide which should have an average particle diameter in the range from 0.01 to 3 μm in view of the sinterability since course particles of silicon carbide require a higher sintering temperature. It is of coures that the powder of silicon carbide should have a purity as high as possible. In consideration of these requirements in the particle size distribution and purity, a quite satisfactory silicon carbide powder can be obtained, for example, by the method taught in Japanese Patent Kokai No. 60-46912 according to which the silicon carbide powder is produced by the vapor-phase pyrolysis of a methyl hydrogen silane compound represented by the general formula

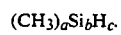

in which b is 1, 2 or 3, $2b+1 \geq a$, $a \geq b$, $2b+1 \geq c$, $c \geq 1$ and $a+c=2b+2$, such as tetramethyl disilane, after purification by distillation at a temperature in the range from 750° to 1600° C. in a stream of a carrier gas. The particles of silicon carbide obtained by the vapor-phase pyrolysis of a methyl hydrogen silane compound have high surface activity and the particle is composed of fine crystallites having a diameter of 5 nm or smaller. The thus obtained β-type silicon carbide particles have a spherical configuration with an average particle diameter of 0.01 to 1 μm so that the silicon carbide powder can be used as produced without further pulverization. Moreover, the methyl hydrogen silane as the starting material of the vapor-phase pyrolysis can be easily purified by distillation so that the resultant silicon carbide powder also may have an extremely high purity. Although the silicon carbide powder obtained by the vapor-phase pyrolysis of a methyl hydrogen silane compound has the β-type crystallographic structure, silicon carbide powders of the α-type prepared by other methods can be used satisfactorily.

In the first step of the inventive method, the above described silicon carbide powder is admixed with boron or a boron compound, which is a known sintering aid for silicon carbide powders. Suitable boron compounds include boron carbide, titanium boride, boron oxide and the like. The amount of boron or the boron compound added to the silicon carbide powder should be in the range from 0.1 to 5.0% by weight as boron based on the silicon carbide powder. When the amount of the sintering aid is too small, no sufficient effect of sintering promotion can be obtained as a matter of course so that the resultant sintered body would have a somewhat decreased density. When the amount thereof is too large, on the other hand, the sintered body may have a satisfactorily high density but at the sacrifice of the electric resistivity.

In the second step of the inventive method for the preparation of a sintered body of silicon carbide, the thus obtained powdery mixture of the silicon carbide powder and the sintering aid is molded by compression into a green body of the desired form. The method of the compression molding can be conventional and need not be described in more detail.

In the third step of the inventive method, the green body prepared by the compression molding of the powdery mixture is heated at a high temperature and sintered into a sintered body. It has been quite unexpectedly discovered that, in this sintering treatment, an essential role is played by the chemical constituents of the atmospheric gas on the properties of the sintered body, in particular, in respect of the electric resistivity and thermal conductivity.

Namely, the green body should be sintered in an atmosphere of an inert gas containing nitrogen in a minor concentration. The inert gas here implied is a rare gas such as helium, argon and the like. The concentration of nitrogen in the atmosphere of mainly the inert gas should be in the range from 0.005 to 5% by volume or, preferably, from 0.01 to 2% by volume. When the concentration of nitrogen in the atmospheric gas is too low, no sufficient upgrading effect can be obtained on the electric resistivity of the sintered body. When the concentration of nitrogen in the gaseous atmosphere is too high, on the other hand, the sintered body cannot be upgraded not only in respect of the electric resistivity but also in respect of the density.

A requirement for the inert gas of the atmosphere is that the gas is stable and non-reactive with the material under the sintering treatment at the temperature of sintering in the range from 1800° to 2200° C. so that rare gases including argon, helium and neon are usually preferred. The inert gas as well as the nitrogen gas to form the atmosphere of sintering should have a purity as high as possible or, usually, should have a purity of at least 99.9% since impurity gases contained therein may have an adverse effect on the electric resistivity of the sintered body.

The furnace for sintering should be filled with the nitrogen-containing inert gas throughout the sintering procedure. Thus, the sintering furnace, in which the green bodies have been introduced, is first evacuated and then filled with the inert gas containing nitrogen in a desired concentration and then sealed followed by increase of the temperature and release of the pressure produced by the temperature increase to keep the pressure inside the furnace at about the atmospheric pressure. Alternatively, the process of sintering can be performed under a stream of the nitrogen-containing inert gas. The flow rate of the gas is not particularly limitative and should be selected adequately depending on the structure of the sintering furnace and other factors although an extremely small flow rate is undesirable due to eventual intrusion of the atmospheric air into the furnace while an extremely large flow rate is of course undesirable due to the danger of scattering of the green bodies in the furnace and excessively large power consumption for the temperature increase of the furnace.

As is mentioned before, the treatment of sintering can be performed under normal pressure without the necessity of using a hot-press since the green body under sintering is shaped by admixing the silicon carbide powder with boron or a boron compound as a sintering aid. The temperature of sintering should be in the range from 1800° to 2200° C. or, preferably, from 1950° to 2150° C. When the temperature for sintering is too low, the green body cannot be fully sintered so that the sintered body would have a somewhat decreased density. When the temperature of sintering is too high, on the other hand, undue grain growth and thermal decomposition of silicon carbide may take place so that the sintered body has a decreased electric resistivity and mechanical strength.

In contrast to the conventional sintered bodies of silicon carbide prepared by a prior art method having a volume resistivity of $10^4$ to $10^6$ ohm.cm, the sintered body of silicon carbide prepared by the above described inventive method may have a volume resistivity of as high as $10^{10}$ to $10^{13}$ ohm.cm along with the coefficient of thermal conductivity of 100 to 220 W/m.K so that the sintered bodies of silicon carbide prepared by the inventive method are very useful as a material of various kinds of electronic components such as substrate plates of integrated circuits and the like.

In the following, the method of the invention is described in more detail by way of examples. The coefficients of the thermal conductivity appearing in the following examples are the results of the measurement undertaken by the xenon flash method.

EXAMPLE 1

A quartz glass-made reactor tube of 1000 mm long having an inner diameter of 50 mm was heated at 1200° C. in an upright tubular furnace and a gaseous mixture of 95% by volume of hydrogen and 5% by volume of 1,1,2,2-tetramethyl disilane was introduced thereinto at a constant rate of 1000 ml/minute to effect vapor-phase pyrolysis of the disilane compound. The thus obtained fine particles of β-type silicon carbide had a structure of agglomerates having an average particle diameter of 0.1 µm and a specific surface area of 37.3 m²/g.

A powdery mixture composed of 14.955 g of this fine powder of silicon carbide and 0.045 g of boron powder (a product by Rare Metallic Co.) was compression-molded in a metal mold into a disc-like form having a diameter of 10 mm and a thickness of 1.5 mm which was further compressed in a rubber press under a pressure of 1.5 tons/cm². Five pieces of green bodies were prepared in this manner, which are referred to as the samples No. 1 to No. 5.

These green bodies were placed in an electric furnace for sintering and, after evacuation, the space inside the furnace was filled with argon gas containing 0.2% by volume of nitrogen until the pressure inside the furnace reached atmospheric. Thereafter, temperature increase of the electric furnace was started while a gaseous mixture composed of 99.8% by volume of argon and 0.2% by volume of nitrogen was continuously introduced into the furnace at a constant rate of 1000 ml/minute with the gas-discharge valve open. The temperature was increased up to 2100° C. and this temperature was maintained for 30 minutes followed by cooling to room temperature. The thus obtained sintered bodies were polished on the surface and subjected to the measurements of density, electric volume resistivity and coefficient of thermal conductivity to give the results shown in Table 1 below.

TABLE 1

| | Sample No. | | | | |
|---|---|---|---|---|---|
| | 1 | 2 | 3 | 4 | 5 |
| Density, g/cm³ | 3.16 | 3.17 | 3.15 | 3.13 | 3.11 |
| Volume resistivity, ohm · cm | $6.0 \times 10^{12}$ | $8.0 \times 10^{13}$ | $4.2 \times 10^{12}$ | $2.0 \times 10^{13}$ | $3.1 \times 10^{13}$ |
| Thermal conductivity, W/m · K | 221 | 198 | 180 | 203 | 175 |

EXAMPLE 2

A powdery mixture composed of 99.7% by weight of the fine powder of silicon carbide prepared in Example 1 from the disilane compound and 0.3% by weight of boron powder was shaped into green bodies and sintered into sintered bodies in the same manner as in Example 1 except that the concentration of nitrogen in the gaseous mixture of argon and nitrogen was varied as shown in Table 2 below with the overall flow rate of the atmospheric gas being 1000 ml/minute in each of the sintering procedures for the sample specimens No. 6 to No. 13. The samples No. 6 to No. 9 were for the invention and No. 10 to No. 13 were for comparative purpose in respect of the concentration of nitrogen in the argon atmosphere. The sintered bodies were subjected to the measurements of density, electric volume resistivity and coefficient of thermal conductivity to give the results shown in Table 2.

TABLE 2

| | | Sample No. | | | | | | | |
|---|---|---|---|---|---|---|---|---|---|
| | | 6 | 7 | 8 | 9 | 10 | 11 | 12 | 13 |
| Gaseous atmosphere | Concentration of nitrogen, % by volume | 0.005 | 0.01 | 1 | 5 | 10 | 0 | 0.002 | 15 |
| | Flow rate of nitrogen, ml/minute | 0.05 | 0.1 | 10 | 50 | 100 | 0 | 0.02 | 150 |
| | Flow rate of argon, ml/minute | 999.95 | 999.9 | 990 | 950 | 900 | 1000 | 999.98 | 850 |
| Sintered body | Density, g/cm³ | 3.12 | 3.15 | 3.13 | 3.11 | 3.09 | 3.16 | 3.15 | 3.00 |
| | Volume resistivity, ohm · cm | $5.8 \times 10^{10}$ | $2.1 \times 10^{11}$ | $8.4 \times 10^{12}$ | $4.5 \times 10^{11}$ | $2.3 \times 10^{10}$ | $2.8 \times 10^{4}$ | $3.5 \times 10^{9}$ | $3.0 \times 10^{3}$ |
| | Thermal conductivity, W/m · K | 128 | 165 | 150 | 185 | 139 | 115 | 154 | 128 |

EXAMPLE 3

The experimental procedure was substantially the same as in Example 1 except that the boron powder was replaced with boron carbide, titanium boride or boron oxide in the preparation of the samples No. 14, No. 15 and No. 16, respectively, in an amount equivalent to 0.3% by weight of boron powder calculated as boron. The sintered bodies were subjected to the measurements of density, electric volume resistivity and coefficient of thermal conductivity in the same manner as in Example 1 to give the results shown in Table 3 below.

TABLE 3

| | | Sample No. | | |
|---|---|---|---|---|
| | | 14 | 15 | 16 |
| Powdery mixture | Silicon carbide taken, g | 14.943 | 14.855 | 14.855 |
| | Additive (g) | $B_4C$ (0.057) | $TiB_2$ (0.145) | $B_2O_3$ (0.145) |
| | Content of boron % by weight | 0.3 | 0.3 | 0.3 |
| Sintered body | Density, g/cm³ | 3.14 | 3.05 | 3.03 |
| | Volume resistivity, ohm · cm | $2.3 \times 10^{12}$ | $5.8 \times 10^{12}$ | $8.9 \times 10^{12}$ |
| | Thermal conductivity, W/m · K | 125 | 158 | 118 |

EXAMPLE 4

Four sintering tests were undertaken each in substantially the same manner as in Example 1 except that the amount of the boron powder in the powdery mixture with the fine powder of silicon carbide prepared in Example 1 was varied as indicated in Table 4 below and the concentration of nitrogen in the gaseous atmosphere of sintering was 0.5% by volume. Samples No. 19 and No. 20 are for comparative purpose in respect of the insufficient or excessive amount of boron. The sintered bodies were subjected to the measurement of density, electric volume resistivity and coefficient of thermal conductivity to give the results shown in Table 4 below. The sintered body sample No. 19 was not suitable for the measurement of the volume resistivity and coefficient of thermal conductivity due to insufficient densification.

TABLE 4

|  | Sample No. | | | |
| --- | --- | --- | --- | --- |
|  | 17 | 18 | 19 | 20 |
| Content of boron, % by weight | 0.2 | 1.0 | 0.05 | 7 |
| Density, g/cm$^3$ | 3.05 | 3.16 | 2.83 | 3.02 |
| Volume resistivity, ohm · cm | $8.5 \times 10^{12}$ | $6.8 \times 10^{12}$ |  | $3.2 \times 10^3$ |
| Thermal conductivity, W/m · K | 186 | 190 |  | 98 |

What is claimed is:

1. A method for the preparation of a sintered body of silicon carbide having a relative density of at least 90% and an electric volume resistivity in the range from $10^{10}$ to $10^{13}$ ohm-cm, which comprises the steps of:

(a) pyrolyzing a methyl hydrogen silane represented by the general formula $(CH_3)_a Si_b H_c$, wherein b is 1,2 or 3, 2b+1 is not less than a, a is not less than b, 2b+1 is not less than c, c is a positive integer and a+c is equal to 2b+2, in the vapor phase to give a β-type silicon carbide powder;

(b) admixing the β-type silicon carbide powder with boron or a boron compound in an amount in the range of 0.1 to 5.0% by weight as boron to give a uniform powdery mixture;

(c) molding the powdery mixture by compression molding to give a green body; and (d) heating the green body under normal pressure in an atmosphere of a rare gas containing nitrogen in a concentration in the range from 0.01 to 2% by volume at a temperature in the range from 1800° to 2200° C. to effect sintering of the green body.

2. The method for the preparation of a sintered body of silicon carbide as claimed in claim 1 wherein the boron compound is selected from the group consisting of boron carbide, titanium boride and boron oxide.

3. The method for the preparation of a sintered body of silicon carbide as claimed in claim 1 wherein the β-type silicon carbide powder has a spherical configuration with an average particle diameter in the range from 0.01 to 1 μm.

4. The method for the preparation of a sintered body of silicon carbide as claimed in claim 1 wherein the particle of the β-type silicon carbide powder is composed of crystallites having a diameter of 5 nm or smaller.

5. The method for the preparation of a sintered body of silicon carbide as claimed in claim 1 wherein the pyrolysis of the methyl hydrogen silane is performed at a temperature in the range from 750° to 1600° C.

6. The method for the preparation of a sintered body of silicon carbide as claimed in claim 1 wherein the temperature in step (d) is in the range from 1950° to 2150° C.

7. The method for the preparation of a sintered body of silicon carbide as claimed in claim 1 wherein the methyl hydrogen silane is tetramethyl disilane.

* * * * *